(12) United States Patent
Chang et al.

(10) Patent No.: US 8,385,066 B2
(45) Date of Patent: Feb. 26, 2013

(54) FLOW CONTROL DEVICE AND COOLED ELECTRONIC SYSTEM EMPLOYING THE SAME

(75) Inventors: Chris S C Chang, Taipei (TW); Edward Y C Kung, Xindian (TW); Bill K P Lam, Taipei (TW); Ian Y Y Lin, Taipei (TW); Morgan Y L Wu, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 12/943,089

(22) Filed: Nov. 10, 2010

(65) Prior Publication Data

US 2011/0128704 A1    Jun. 2, 2011

(30) Foreign Application Priority Data

Nov. 30, 2009   (TW) .............................. 98140912 A (51) Int. Cl.
*H05K 7/20* (2006.01)
*G06F 1/20* (2006.01)

(52) U.S. Cl. .................... 361/697; 361/679.48; 361/690; 361/692; 361/695; 165/80.3; 165/121; 165/185; 454/184; 236/1 G; 236/49.1; 236/49.3; 236/49.5; 236/68 R; 236/101 D (58) Field of Classification Search ............... 361/679.46–679.55, 690–697, 361/700–712; 165/80.3, 104.33, 121–126, 165/185; 236/1 G, 491, 49.3, 49.5, 68 R, 236/101 D; 174/16.3, 252; 251/9, 11; 454/184
See application file for complete search history.

(56) References Cited

U.S. PATENT DOCUMENTS

| | | | | |
|---|---|---|---|---|
| 4,495,545 A | * | 1/1985 | Dufresne et al. | 361/695 |
| 4,497,241 A | * | 2/1985 | Ohkata | 454/258 |
| 4,699,314 A | * | 10/1987 | Faurie | 236/49.5 |
| 6,128,188 A | | 10/2000 | Hanners | |

(Continued)

FOREIGN PATENT DOCUMENTS

| | | | |
|---|---|---|---|
| DE | 202008017021 | | 4/2009 |
| JP | 2009169873 A | * | 7/2009 |

(Continued)

OTHER PUBLICATIONS

Chiu Yung-Yu et al. "Heat Dissipation Module and Flow Direction Control Structure Thereof", TWI281848(B), May 21, 2007, English Abstract, 1 pages.

*Primary Examiner* — Michail V Datskovskiy
(74) *Attorney, Agent, or Firm* — Cynthia G. Seal; Jeffrey L. Streets (57) ABSTRACT

A flow control device and a related cooled electronic system are provided. The electronic system comprises a first heat dissipation component and a second heat dissipation component. The flow control device controls an amount of an air flow to the first heat dissipation component and the second heat dissipation component. In one illustrative embodiment, the flow control device comprises: a memory metal component coupled to the first heat dissipation component and the second heat dissipation component and a movable component comprising a first end and a second end. The first end is coupled to a point between two ends of the memory metal component and the second end is movable with respect to the first end. In response to a temperature difference between the first heat dissipation component and the second heat dissipation component, the second end approaches the first heat dissipation component or the second heat dissipation component.

24 Claims, 5 Drawing Sheets

U.S. PATENT DOCUMENTS

| | | | |
|---|---|---|---|
| 6,239,686 B1 | 5/2001 | Eder et al. | |
| 6,278,607 B1 | 8/2001 | Moore et al. | |
| 6,330,155 B1 * | 12/2001 | Remsburg | 361/695 |
| 6,330,157 B1 | 12/2001 | Bezama et al. | |
| 6,633,095 B1 * | 10/2003 | Swope et al. | 310/12.19 |
| 7,079,387 B2 | 7/2006 | Brooks et al. | |
| 7,154,749 B2 | 12/2006 | Stefanoski et al. | |
| 7,206,202 B2 | 4/2007 | Yang | |
| 7,209,352 B2 | 4/2007 | Chen | |
| 7,220,051 B2 | 5/2007 | Shahinpoor | |
| 7,301,767 B2 | 11/2007 | Takenoshita et al. | |
| 7,355,850 B2 | 4/2008 | Baldwin, Jr. | |
| 7,361,081 B2 | 4/2008 | Beitelmal et al. | |
| 7,480,141 B2 * | 1/2009 | Takenoshita et al. | 361/695 |
| 7,583,501 B2 * | 9/2009 | Yamanaka | 361/695 |
| 7,778,029 B2 * | 8/2010 | Ueno | 361/695 |
| 7,903,418 B2 * | 3/2011 | Tracy et al. | 361/714 |
| 2010/0089549 A1 | 4/2010 | Su et al. | |

FOREIGN PATENT DOCUMENTS

| | | |
|---|---|---|
| TW | I281848 | 10/1993 |

* cited by examiner

FLOW CONTROL DEVICE AND COOLED ELECTRONIC SYSTEM EMPLOYING THE SAME

CROSS-REFERENCE TO RELATED APPLICATIONS

This application claims priority under 35 U.S.C. §119 to Taiwanese Patent Application No. 98140912 filed Nov. 30, 2009, the entire text of which is specifically incorporated by reference herein.

BACKGROUND

1. Field of the Invention

The various embodiments described herein relate generally to an electronic system, and more particularly to a flow control device and a cooled electronic system.

2. Background of the Related Art

Various electronic systems related to information technology (for example, a personal computer or high-end server) have significantly improved as a result of active research. However, some components (for example, a central processing unit (CPU), memory device, and so on) in the electronic systems generate lots of heat and require cooling to dissipate the heat generated during operation. Cooling fans and heat sinks are typically used inside the electronic systems for heat dissipation damage to the system due to overheating may be prevented.

Generally, cooling air flows generated by one or more fan assemblies are forced through the electronic system, thereby helping to cool the components inside electronic systems. The forced air flow may bypass some components and/or flow over other components. The above operation may be achieved via an air baffle mechanism or other similar mechanisms. For example, the air flow through the electronic systems may be controlled and routed to certain regions, such as the fins of the heat sink. The paths of the above air flow control and routing operations are typically referred as channels.

For some electronic systems, such as high-density systems, a multiprocessor architecture is often used. The design may, for example, comprise the design of two half-wide boards using two processors (which work independently in a chassis) or the design using four processors. Regarding the design using two processors, a heat dissipation module using dual thermal channels may be used for heat dissipation. The heat dissipation module using dual thermal channels may comprise a first heat sink, a second heat sink, a fixedly arranged air baffle, and one or more cooling fans. The one or more cooling fans provide air flows respectively to the first heat sink and the second heat sink for heat dissipation. The fixedly arranged air baffle distributes the air flows from the one or more fans respectively to the first heat sink and the second heat sink. The air flows may be guided to the electronic components (for example, the top positions of the processors) via the channels. Thus, the heat generated during operation may be discharged outside of the system to achieve the purpose of heat dissipation.

In a system having a multiprocessor architecture, it is typical that some processors may not operate at a given point in time. For example, in a dual-processor architecture, there are at least two situations for the processors: both processors are in operation or only one processor is in operation. The speed of the one or more fans may be raised for fully coping with the above two situation. However, when only one processor is in operation, raising the speed of the one or more fans will result in a waste of energy.

In addition, raising the speed of the one or more fans in order to support the above situations (even with only one processor in operation) will also results in making louder noise.

BRIEF SUMMARY

One embodiment of the invention provides a flow control device adapted for an electronic system comprising a first heat dissipation component and a second heat dissipation component, where the flow control device controls an amount of an air flow to the first heat dissipation component and the second heat dissipation component. The flow control device comprises a memory metal component coupled to the first heat dissipation component and the second heat dissipation component, and a movable component comprising a first end and a second end, wherein the first end is coupled to a point between two ends of the memory metal component and the second end is movable with respect to the first end. In response to a temperature difference between the first heat dissipation component and the second heat dissipation component, the second end approaches the first heat dissipation component or the second heat dissipation component.

Another embodiment of the invention provides a cooled electronic system comprising an electronic assembly comprising a support structure supporting a first heat generating component to be cooled and a second heat generating component to be cooled. The system also comprises a first heat dissipation component and a second heat dissipation component respectively arranged for the first heat generating component and the second heat generating component for heat dissipation. Still further, the system comprises a fan providing an air flow to the first heat dissipation component and the second heat dissipation component, and a flow control device for controlling an amount of the air flow to the first heat dissipation component and the second heat dissipation component. The flow control device comprises a memory metal component coupled to the first heat dissipation component and the second heat dissipation component, and a movable component comprising a first end and a second end, the first end coupled to a point between two ends of the memory metal component and the second end movable with respect to the first end. In response to a temperature difference between the first heat dissipation component and the second heat dissipation component, the second end approaches the first heat dissipation component or the second heat dissipation component.

A further embodiment provides a flow control method for a cooled electronic system. The method comprises employing a flow control device for an electronic system comprising a first heat dissipation component and a second heat dissipation component, the flow control device controlling an amount of an air flow to the first heat dissipation component and the second heat dissipation component. The flow control device comprises a memory metal component coupled to the first heat dissipation component and the second heat dissipation component, and a movable component comprising a first end and a second end, wherein the first end is coupled to a point between two ends of the memory metal component and the second end is movable with respect to the first end. In response to a temperature difference between the first heat dissipation component and the second heat dissipation component, the second end approaches the first heat dissipation component or the second heat dissipation component.

BRIEF DESCRIPTION OF THE SEVERAL VIEWS OF THE DRAWINGS

In order that the advantages of the various embodiments will be readily understood, a more particular description of the various embodiments briefly described above will be provided by reference to specific exemplary embodiments that are illustrated in the accompanying drawings, which depict only exemplary embodiments and are not to be considered to be limiting in scope. The various embodiments are to be described and explained with additional specificity and detail through the use of the accompanying drawings, in which.

DETAILED DESCRIPTION

One embodiment of the present invention provides a flow control device for an electronic system. The electronic system comprises a first heat dissipation component and a second heat dissipation component. The flow control device controls a flow of an air flow to the first heat dissipation component and the second heat dissipation component. The flow control device may comprise a memory metal component coupled to the first heat dissipation component and the second heat dissipation component and a movable component comprising a first end and a second end. The first end may be coupled to a point between two ends of the memory metal component. The second end may be movable with respect to the first end. In response to a temperature difference between the first heat dissipation component and the second heat dissipation component, the second end may approach the first heat dissipation component or the second heat dissipation component.

A length difference of the memory metal component may be reversely proportional to a temperature difference of the memory metal component or may be proportional to a temperature difference of the memory metal component.

The memory metal component may comprise a first portion corresponding to the first heat dissipation component and a second portion corresponding to the second heat dissipation component. In response to the temperature on the first heat dissipation component being lower than the temperature on the second heat dissipation component, the first portion may deform (e.g., extend) such that the second end diverts toward the first heat dissipation component and the air flow to the second heat dissipation component is greater than the air flow to the first heat dissipation component. In response to the temperature on the second heat dissipation component being lower than the temperature on the first heat dissipation component, the second portion may deform (e.g., extend) such that the second end diverts toward the second heat dissipation component and the air flow to the first heat dissipation component is greater than the air flow to the second heat dissipation component.

The memory metal component may be made of a shape changing memory metal material selected from a group comprising a nickel-titanium alloy and nickel-titanium-cobalt alloy. The memory metal component may have a shape selected from a group comprising a ribbon-like shape, a spiral shape, a stripe shape, a rod shape, a bar shape, and a rope shape.

The movable component may be in pivot arrangement (i.e., pivotally coupled) on the memory metal component. A pivot point for the pivot arrangement may be between the first end and the second end. The movable component may comprise a plate made of a material selected from a group comprising of polyester, acrylic resin, glass fiber, resin, and polycarbonate. The movable component may be coupled to the memory metal component at the pivot point by a mechanical coupling selected from a group comprising a direct coupling member, a linkage member, and an engagement member. Furthermore, the movable component may be an air baffle separating the first heat dissipation component and the second heat dissipation component such that the first heat dissipation component and the second heat dissipation component respectively have an air channel.

The first heat dissipation component and the second heat dissipation may be symmetrically arranged or asymmetrically arranged. The first heat dissipation component may be arranged adjacent to the first heat generating component. The second heat dissipation component may be arranged adjacent to the second heat generating component. In response to the first heat generating component being inactive, the second end may divert toward the first heat dissipation component and the air flow to the second heat dissipation component may be greater than the air flow to the first heat dissipation component. In response to the second heat generating component being inactive, the second end may divert toward the second heat dissipation component and the air flow to the first heat dissipation component may be greater than the air flow to the second heat dissipation component.

The flow control device may be modularly formed and detachably attached in a position between the first heat dissipation component and the second heat dissipation component. The flow control device may be disposed in one or more system positions of the electronic system.

The first heat dissipation component and the second heat dissipation component may coact with (or cooperate with) a fan providing the air flow to the first heat dissipation component and the second heat dissipation component.

Another embodiment of the present invention provides a cooled electronic system. The cooled electronic system may comprise an electronic assembly comprising a support structure supporting a first heat generating component to be cooled and a second heat generating component to be cooled; a first heat dissipation component and a second heat dissipation component respectively arranged to contact the first heat generating component and the second heat generating component for heat dissipation; a fan for providing an air flow to the first heat dissipation component and the second heat dissipation component; and a flow control device for controlling a flow of the air flow to the first heat dissipation component and the second heat dissipation component. The flow control device may comprise: a memory metal component coupled to the first heat dissipation component and the second heat dissipation component and a movable component comprising a first end and a second end. The first end may be coupled to a point between two ends of the memory metal component and the second end may be movable with respect to the first end. In response to a temperature difference between the first heat dissipation component and the second heat dissipation component, the second end may approach the first heat dissipation component or the second heat dissipation component.

A further embodiment of the present invention provides a flow control method for a cooled electronic system. The method comprises employing a flow control device for an electronic system comprising a first heat dissipation component and a second heat dissipation component. The flow control device may control an amount of an air flow to the first heat dissipation component and the second heat dissipation component. The flow control device may comprise: a memory metal component coupled to the first heat dissipation component and the second heat dissipation component and a movable component comprising a first end and a second end. The first end may be coupled to a point between two ends of the memory metal component and the second end may be movable with respect to the first end. In response to a temperature difference between the first heat dissipation component and the second heat dissipation component, the second end may approach the first heat dissipation component or the second heat dissipation component.

Figure 1:
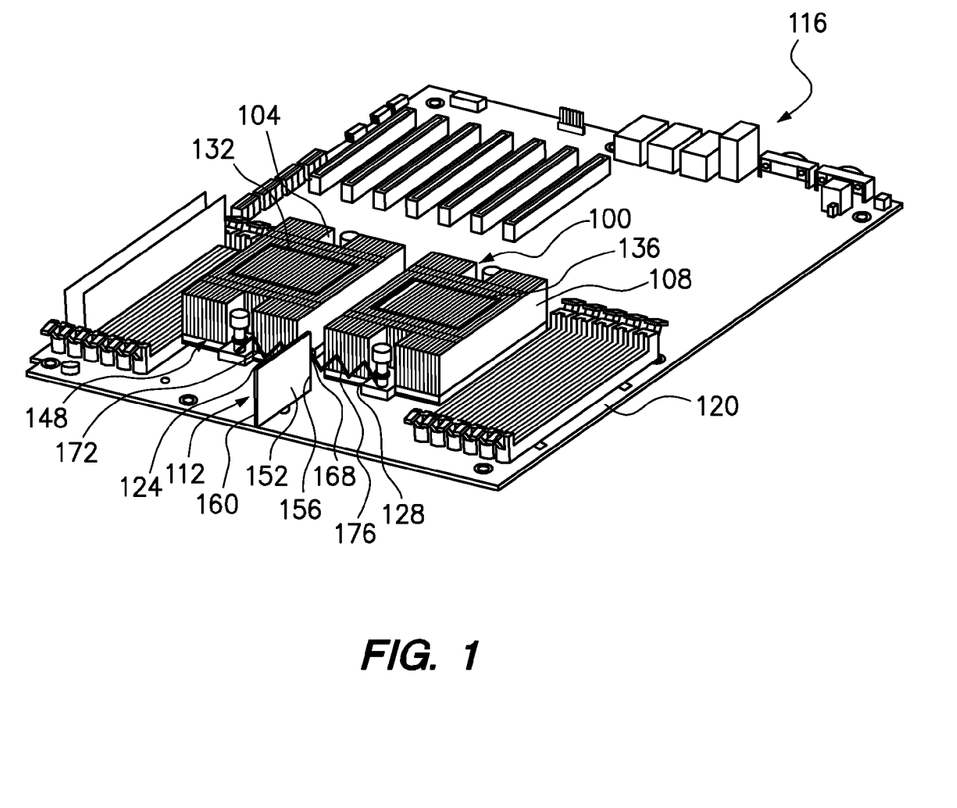
FIG. 1 shows a cooled electronic system in accordance with an exemplary embodiment.
Figure 5:
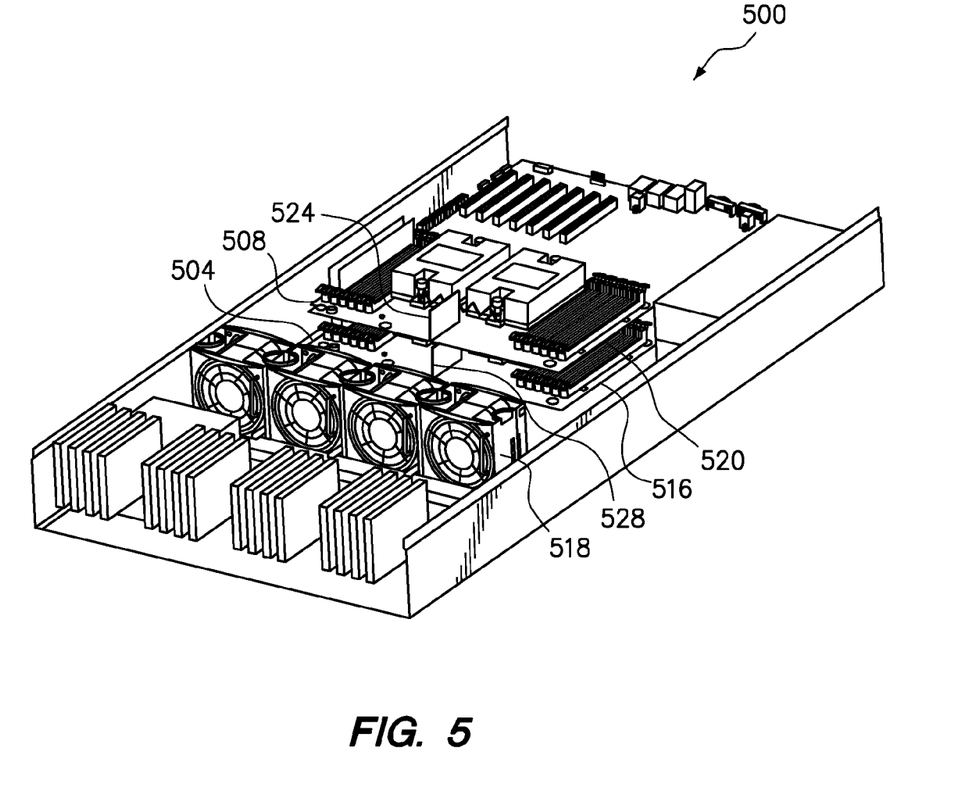
FIG. 5 shows a cooled electronic system in accordance with an exemplary embodiment.

Please refer to FIG. 1, which shows an electronic system 116 comprising a motherboard (also commonly called a planar or system board) 120 in accordance with an exemplary embodiment. The motherboard 120 is mounted within the electronic system 116 and provides a means for mounting and electrically interconnecting various components of the system 116. The electronic system 116 may be, for example but not limited to, a high-density rack server with dual processors. According to an exemplary embodiment, the electronic system 116 may use the design of two half-wide boards. For example, the electronic system 116 may comprise two half-wide boards 124 and 128 arranged on the motherboard 120. The electronic system 116 may further comprise two heat generating components 132 and 136 (for example but not limited to two CPUs (central processing units)), and at least one fan (for example but not limited to four fans 518, as shown in FIG. 5).

The electronic system 116 may further comprise a heat dissipation module 100. The heat dissipation module 100 may comprise a first heat dissipation component 104, a second heat dissipation component 108, and a flow control device 112. The first heat dissipation component 104 and the second heat dissipation component 108 may be symmetrically or asymmetrically arranged on the motherboard 120. For a clearer explanation, the cover and the fans 518 of the electronic system 116 are removed to more clearly show the structure inside the electronic system 116.

According to an exemplary embodiment, the first heat generating component 132 and the second heat generating component 136 are fixedly arranged respectively under the first heat dissipation component 104 and the second heat dissipation component 108. The heat generated from the first heat generating component 132 and the second heat generating component 136 is dissipated via the first heat dissipation component 104 and the second heat dissipation component 108, respectively. The fans 518 are used to generate air flows to the first heat dissipation component 104 and the second heat dissipation component 108. The first heat dissipation component 104 is located corresponding to the first heat generating component 132 for heat dissipation and the second heat dissipation component 108 is located corresponding to the second heat generating component 136 for heat dissipation as is well known in the art.

The flow control device 112 controls distribution of the air flow from the fans 518 to the first heat dissipation component 104 and the air flow from the fans 518 to the second heat dissipation component 108. The flow control device 112 may comprise a memory metal component 148 and a movable component 152 having a first end 156 and a second end 160. The memory metal component 148 is coupled between the first heat dissipation component 104 and the second heat dissipation component 108. The first end 156 is generally coupled to a point between two ends of the memory metal component 148, such as a middle point of the memory metal component 148. The second end 160 is movable with respect to the first end 156. In response to a temperature difference between the first heat dissipation component 104 and the second heat dissipation component 108, the second end 160 approaches (i.e., moves toward) the first heat dissipation component 104 or the second heat dissipation component 108.

In details, the memory metal component 148 may be made of a shape changing memory metal material. The temperature conditions of shape changing depend on various materials. For example, a length of the memory metal component 148 may be reversely proportional to a temperature difference of the memory metal component 148. Alternatively, a length of the memory metal component 148 is proportional to a temperature difference of the memory metal component 148. According to an exemplary embodiment, the shape changing memory metal material may be, for example but not limited to, a nickel-titanium (Ni—Ti) alloy or nickel-titanium-cobalt (Ni—Ti—Co) alloy.

According to an exemplary embodiment, the memory metal component 148 may be a muscle wire made of nickel-titanium alloy. The term muscle wire used herein indicates an elongate object of shape changing memory metal. The conditions for shape changing depend on different materials. In the case of a nickel-titanium alloy memory metal, for example, the memory metal component 148 shrinks (e.g., the length is shorter) in response to a temperature rise, and the memory metal component 148 extends (e.g., the length is longer) in response to a temperature fall. The shape-recovery temperature of nickel-titanium alloy ranges from about 20° to 60° C. The shape-recovery temperature of nickel-titanium-cobalt alloy ranges from about −30° to 30° C. The function and performance of the memory metal component 148 are explained further later on in this description.

In one preferred embodiment, the memory metal components 148 are a muscle wire of nickel-titanium alloy. The muscle wire in accordance with the invention may have many shapes, such as a ribbon-like shape, a spiral shape, a stripe shape, a rod shape, a bar shape, a rope shape or any other suitable shape, and different cross-sections, e.g. circular, triangular, square, star or any other suitable cross-section.

In more detail, the memory metal component 148 has a first portion 172 corresponding to the first heat dissipation component 104 and a second portion 176 corresponding to the second heat dissipation component 108. In the condition of a symmetrical arrangement of the first heat dissipation component 104 and the second heat dissipation component 108, the first portion 172 and the second portion 176 may be defined by a middle point 168 such that the length of the first portion 172 is equal to that of the second portion 176. Thus, in response to the temperature on the first heat dissipation component 104 being lower than the temperature on the second heat dissipation component 108, the first portion 172 extends such that the second end 160 diverts toward the first heat dissipation component 104 and the air flow to the second heat dissipation component 108 is greater than the air flow to the first heat dissipation component 104. On the other hand, in response to the temperature on the second heat dissipation component 108 being lower than the temperature on the first heat dissipation component 104, the second portion 176 extends such that the second end 160 diverts toward the second heat dissipation component 108 and the air flow to the first heat dissipation component 104 is greater than the air flow to the second heat dissipation component 108.

Figure 2:
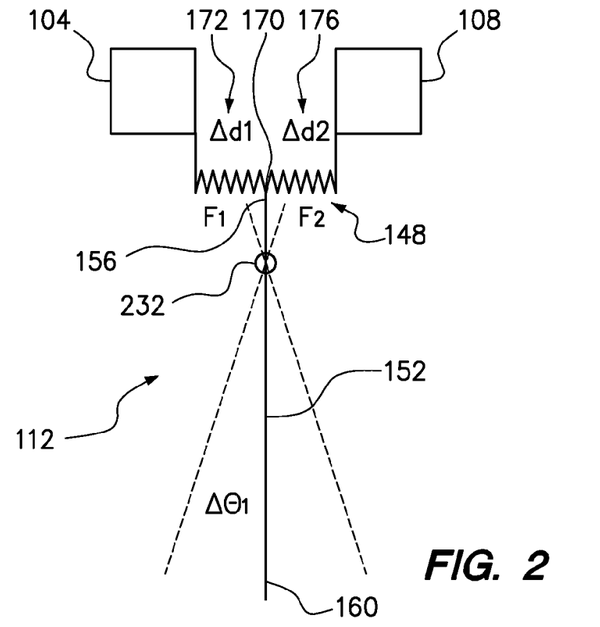
FIG. 2 shows a flow control device in accordance with an exemplary embodiment.

FIG. 2 is a schematic diagram of a flow control device 112 in accordance with an exemplary embodiment consistent with FIG. 1, where like numerals are used to refer to like parts. The flow control device 112 may comprise a memory metal component 148 and a movable component 152 having a first end 156 and a second end 160. The memory metal component 148 is coupled between the first heat dissipation component 104 and the second heat dissipation component 108. The first end 156 is generally coupled to a point between two ends of the memory metal component 148, such as the middle point of the memory metal component 148. The second end 160 is movable with respect to the first end 156. In one preferred embodiment, the movable component 152 is in pivot arrangement on (i.e., pivotally coupled to) the memory metal component 148, and the movable component 152 also has a pivot point 232 between the first end 156 and the second end 160. For example, the pivot point 232 may include a pin extending from the movable component into a hole in the motherboard 120.

Figure 4:
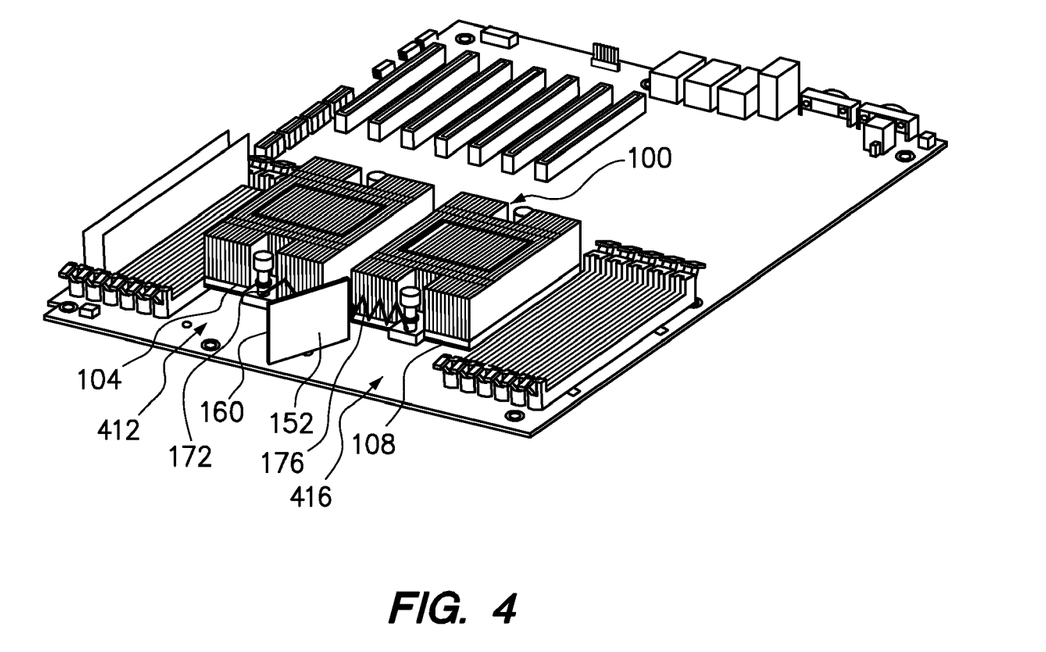
FIG. 4 shows a cooled electronic system in accordance with an exemplary embodiment.

In one preferred embodiment, the movable component 152 may be an air baffle separating the first heat dissipation component 104 and the second heat dissipation component 108 such that the first heat dissipation component 104 and the second heat dissipation component 108 respectively have a first air channel 412 and a second air channel 416 (please refer to FIG. 4). The movable component 152 may comprise a plate, such as a rectangular plate and be made of a thin and light material. The material may be, for example but not limited to polyester, acrylic resin, glass fiber, resin, or polycarbonate.

In one preferred embodiment, the movable component 152 may be coupled to the memory metal component 148 at the point 170 by a mechanical coupling. The mechanical coupling may be, for example but not limited to a direct coupling member, a linkage member, or an engagement member.

Please also refer to FIG. 1 and FIG. 2, the first portion 172 and the second portion 176 may be respectively coupled to the first heat dissipation component 104 and the second heat dissipation component 108. The coupling may be achieved by a direct coupling such that the ends of the first portion 172 and the second portion 176 are clamped in the fin portions of the first heat dissipation component 104 and the second heat dissipation component 108, respectively, or the ends of the first portion 172 and the second portion 176 are clamped in the base portions of the first heat dissipation component 104 and the second heat dissipation component 108, respectively.

FIG. 2 also shows Δd1 and F1, wherein Δd1 represents the length and F1 represents shape change force. Thus, Δd1 represents the displacement of the first portion 172 of the memory metal component 148, and Δd2 represents the displacement of the second portion 176 of the memory metal component 148. In addition, in response to Δd1>Δd2, the movable member 152 will rotate clockwise; in response to Δd1<Δd2, the movable member 152 will rotate counterclockwise; and in response to Δd1=Δd2, the movable member 152 will be in an equilibrium.

Figure 3:
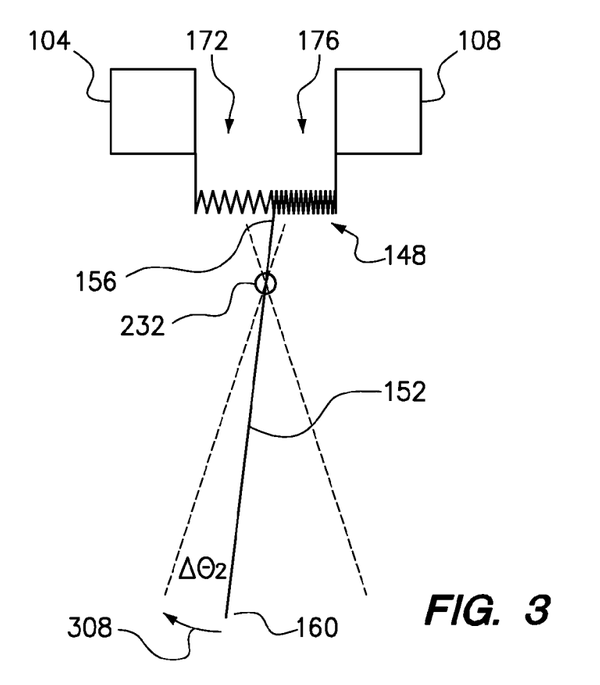
FIG. 3 shows a flow control device in accordance with an exemplary embodiment.

FIG. 3 shows an operation of the movable member 152 of a flow control device 112 in accordance with the exemplary embodiment of FIGS. 1 and 2. The ends of the first portion 172 and the second portion 176 are respectively clamped in the base portions of the first heat dissipation component 104 and the second heat dissipation component 108. Based on some situations resulting in the length d1 of the first portion 172 different from the length d2 of the second portion 176 (such as one of the heat generating components 132 and 136 (See FIG. 1) being inactive), the memory metal component 148 deforms. For example, when using a nickel-titanium alloy as the material of the memory metal component 148 (the length difference thereof is reversely proportional to the temperature difference), in response to the first heat dissipation component 104 being inactive, the first portion 172 with a lower temperature extends (d1<d2), the movable member 152 will rotate clockwise about the pivot point 232 as shown by the arrow 308 in FIG. 3, and the heat equation may be represented by:

$$\Delta H = M \cdot C_p \cdot \Delta T$$

$$\Delta H = (\rho \times V \times A) \times C_p \times \Delta T$$

$$A \propto \ominus$$

$$\rightarrow \Delta H \propto \ominus \cdot \Delta T$$

Wherein:
ΔH=Heat Dissipation
Cp=Specific Heat
M=Mass Flow Rate
ρ=Air Density
V=Air Velocity
ΔT=Temperature difference between the first portion and the second portion
A=Control Surface Area
⊖=Inclining Angle The heat generating components 132 and 136 in FIG. 1 are not limited to CPUs, and may be memory devices, bridge devices, storage devices, and/or other heat generating devices.

According to the above embodiments, the temperature differences between heat generating components 132 and 136 may differ with time. However, these embodiments can achieve dynamic and optimized heat dissipation of heat from the heat generating components 132 and 136. The first portion 172 and the second portion 176 of the memory metal component 148 respectively have length differences in accordance with the temperature differences of the heat generating components 132 and 136 such that an alternating clockwise motion and counterclockwise motion is actuated. Thus, a distribution of the air flow from the fan 518 to the first heat dissipation component 104 and the second heat dissipation component 108 is achieved dynamically.

FIG. 4 shows a cooled electronic system in accordance with the exemplary embodiment of FIGS. 1-3, showing the operation of the movable member 152. In FIG. 4, in response to the temperature on the first heat dissipation component 104 being lower than the temperature on the second heat dissipation component 108, the first portion 172 corresponding to the first heat dissipation component 104 extends with respect to the second portion 176 corresponding to the second heat dissipation component 108 (See FIG. 3) and the second end 160 diverts to approach the first heat dissipation component 104 such that the air flow to the second heat dissipation component 108 is now greater than the air flow to the first heat dissipation component 104. On the other hand, in response to the temperature on the second heat dissipation component 104 being lower than the temperature on the first heat dissipation component 108, the second portion 176 corresponding to the second heat dissipation component 108 will extend with respect to the first portion 172 corresponding to the first heat dissipation component 104, and the second end 160 would divert to approach the second heat dissipation component 108 such that the air flow to the first heat dissipation component 104 would be greater than the air flow to the second heat dissipation component 108.

The heat dissipation module 100 is not limited to the one comprising the first heat dissipation component 104 and the second heat dissipation component 108. Accordingly, the number of heat generating components is not limited to two. As shown in FIG. 5, there are two full-wide boards. The upper full-wide board may comprise a first portion 508 and a second portion 520. The lower full-wide board may comprise a first portion 504 and a second portion 516. The electronic system 500 may comprises four heat dissipation components respectively arranged on the first portion 508 and the second portion 520 of the upper full-wide board and the first portion 504 and the second portion 516 of the lower full-wide board. That is, each portion mounts a heat dissipation component. Flow amount control devices 524 and 528 are respectively arranged in front of the heat dissipation components on the upper full-wide board and the heat dissipation components on the lower full-wide board for heat dissipation with arrangements as described above.

Figure 6:
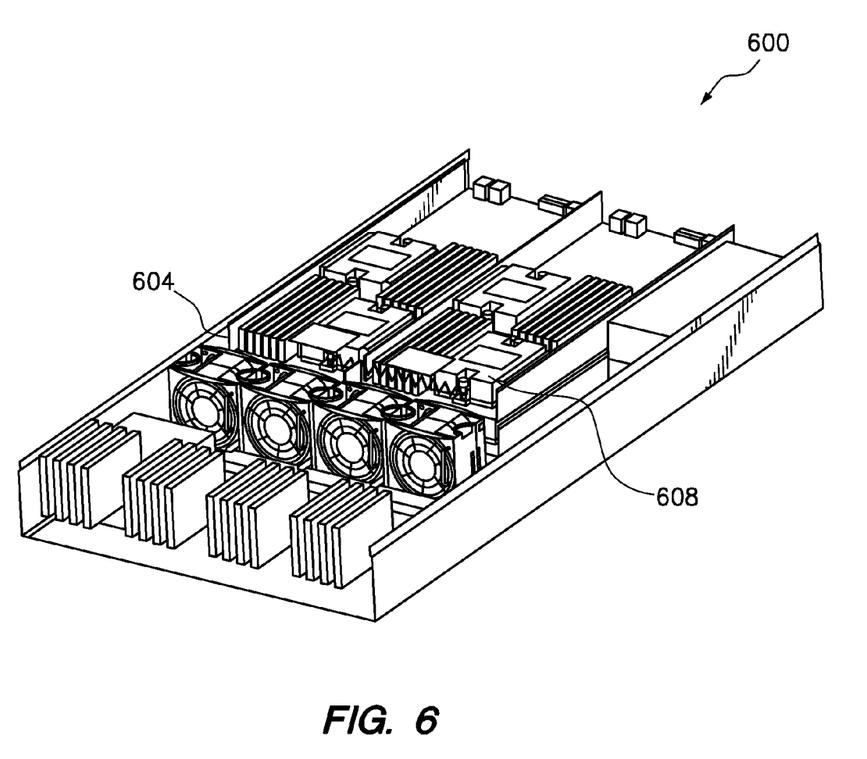
FIG. 6 shows a cooled electronic system in accordance with an exemplary embodiment.

FIG. 6 shows another cooled electronic system 600 in accordance with an exemplary embodiment. As shown in FIG. 6, eight half-wide boards are arranged in two levels: four half-wide boards arranged in the upper level and four half-wide boards in the lower level. Four heat dissipation components are arranged for each level. On the upper level for example, the four heat dissipation components are divided into two groups 604 (on the left) and 608 (on the right), and one flow control device is arranged in front of the groups 604 and 608 at a point (in the middle) between the groups 604 and 608.

The above description is presented to enable any person skilled in the art to make and use the invention, and the present invention is not limited to the embodiments shown. For example, the heat dissipation components are not limited to be divided into two units, and the two units are not limited to be symmetrical. In FIG. 1, the first heat dissipation component 104 and the second heat dissipation component 108 are symmetrically arranged. In FIG. 5, for each full-wide board, the heat dissipation components (for example, the ones on the first portion 504 and the second portion 516 or the ones on the first portion 508 and the second portion 520) are symmetrically arranged. In FIG. 6, the heat dissipation components in the group 604 (or the group 608) are in diagonal arrangement. In general, the heat dissipation components may be arranged in at least two groups and a flow control device may be arranged in front of each two groups of the heat dissipation components, so that dynamic and optimized heat dissipation can be achieved.

In accordance with the various embodiments described herein, a flow control device and a related cooled electronic system are provided. The various embodiments provide efficient thermal dissipation solutions, avoid waste of energy, and relieve the amount of noise generated by the fans.

Exemplary embodiments have been presented for purposes of illustration and description, but such exemplary embodiments are not intended to be exhaustive or limiting. Many modifications and variations will be apparent to those of ordinary skill in the art. The exemplary embodiments have been chosen and described in order to explain principles and practical application, and to enable others of ordinary skill in the art to understand the disclosure for various embodiments with various modifications as are suited to the particular use contemplated. That is, it is to be understood that the various embodiments are not limited to the described exemplary embodiments, and that various other changes and modifications may be affected therein by one skilled in the art without departing from the scope or spirit of the disclosure.

What is claimed is:

1. A flow control device adapted for an electronic system comprising a first heat dissipation component and a second heat dissipation component, the flow control device controlling an amount of an air flow to the first heat dissipation component and the second heat dissipation component, comprising:
    a memory metal component coupled to the first heat dissipation component and the second heat dissipation component; and
    a movable component comprising a first end and a second end, the first end coupled to a point between two ends of the memory metal component and the second end movable with respect to the first end, wherein in response to a temperature difference between the first heat dissipation component and the second heat dissipation component, the second end approaches the first heat dissipation component or the second heat dissipation component.

2. The device of claim 1, wherein a length difference of the memory metal component is reversely proportional to a temperature difference of the memory metal component or is proportional to a temperature difference of the memory metal component.

3. The device of claim 1, wherein the memory metal component comprises a first portion corresponding to the first heat dissipation and a second portion corresponding to the second heat dissipation component.

4. The device of claim 3, wherein in response to the temperature on the first heat dissipation component being lower than the temperature on the second heat dissipation component, the first portion deforms such that the second end diverts toward the first heat dissipation component and the air flow to the second heat dissipation component is greater than the air flow to the first heat dissipation component; and
    wherein in response to the temperature on the second heat dissipation component being lower than the temperature on the first heat dissipation component, the second portion deforms such that the second end diverts toward the second heat dissipation component and the air flow to the first heat dissipation component is greater than the air flow to the second heat dissipation component.

5. The device of claim 1, wherein the memory metal component is made of a shape changing memory metal material selected from a group comprising a nickel-titanium alloy and nickel-titanium-cobalt alloy.

6. The device of claim 1, wherein the memory metal component has a shape selected from a group comprising a ribbon-like shape, a spiral shape, a stripe shape, a rod shape, a bar shape, and a rope shape.

7. The device of claim 1, wherein the movable component is pivotally coupled to the memory metal component at a pivot point between the first end and the second end.

8. The device of claim 1, wherein the first heat dissipation component being arranged adjacent to the first heat generating component and the second heat dissipation component being arranged adjacent to the second heat generating component.

9. The device of claim 1, wherein in response to the first heat generating component being inactive, the second end diverts toward the first heat dissipation component and the air flow to the second heat dissipation component is greater than the air flow to the first heat dissipation component; and
    wherein in response to the second heat generating component being inactive, the second end diverts toward the second heat dissipation component and the air flow to the first heat dissipation component is greater than the air flow to the second heat dissipation component.

10. The device of claim 1, wherein the movable component comprises a plate made of a material selected from a group comprising of polyester, acrylic resin, glass fiber, resin, and polycarbonate.

11. The device of claim 1, wherein the flow control device is modular and detachably attached in a position between the first heat dissipation component and the second heat dissipation component.

12. The device of claim 1, wherein the flow control device is disposed on one or more system positions of the electronic system.

13. The device of claim 1, wherein the movable component is coupled to the memory metal component at the point by a mechanical coupling selected from a group comprising a direct coupling member, a linkage member, and an engagement member.

14. The device of claim 1, wherein the movable component is an air baffle separating the first heat dissipation component and the second heat dissipation component such that the first heat dissipation component and the second heat dissipation component respectively have an air channel on opposing sides of the air baffle.

15. The device of claim 1, wherein the first heat dissipation component and the second heat dissipation component cooperates with a fan providing the air flow to the first heat dissipation component and the second heat dissipation component.

16. A cooled electronic system comprising:
   an electronic assembly comprising a support structure supporting a first heat generating component to be cooled and a second heat generating component to be cooled;
   a first heat dissipation component and a second heat dissipation component respectively arranged for the first heat generating component and the second heat generating component for heat dissipation;
   a fan for providing an air flow to the first heat dissipation component and the second heat dissipation component; and
   a flow control device for controlling an amount of the air flow to the first heat dissipation component and the second heat dissipation component, the flow control device comprising:
   a memory metal component coupled to the first heat dissipation component and the second heat dissipation component, and
   a movable component comprising a first end and a second end, the first end coupled to a point between two ends of the memory metal component and the second end movable with respect to the first end, wherein in response to a temperature difference between the first heat dissipation component and the second heat dissipation component, the second end approaches the first heat dissipation component or the second heat dissipation component.

17. The system of claim 16, wherein the memory metal component comprises a first portion corresponding to the first heat dissipation and a second portion corresponding to the second heat dissipation component;
   wherein in response to the temperature on the first heat dissipation component being lower than the temperature on the second heat dissipation component, the first portion deforms such that the second end diverts toward the first heat dissipation component and the air flow to the second heat dissipation component is greater than the air flow to the first heat dissipation component; and
   wherein in response to the temperature on the second heat dissipation component being lower than the temperature on the first heat dissipation component, the second portion deforms such that the second end diverts toward the second heat dissipation component and the air flow to the first heat dissipation component is greater than the air flow to the second heat dissipation component.

18. The system of claim 16, wherein the memory metal component is made of a shape changing memory metal material selected from a group comprising a nickel-titanium alloy and nickel-titanium-cobalt alloy.

19. The system of claim 16, wherein the first heat dissipation component is arranged adjacent to the first heat generating component and the second heat dissipation component is arranged adjacent to the second heat generating component;
   wherein in response to the first heat generating component being inactive, the second end diverts toward the first heat dissipation component and the air flow to the second heat dissipation component is greater than the air flow to the first heat dissipation component; and
   wherein in response to the second heat generating component being inactive, the second end diverts toward the second heat dissipation component and the air flow to the first heat dissipation component is greater than the air flow to the second heat dissipation component.

20. The system of claim 16, wherein the movable component is an air baffle separating the first heat dissipation component and the second heat dissipation component such that the first heat dissipation component and the second heat dissipation component respectively have an air channel on opposing sides of the air baffle.

21. A flow control method for a cooled electronic system, comprising:
   employing a flow control device for an electronic system comprising a first heat dissipation component and a second heat dissipation component, the flow control device controlling an amount of an air flow to the first heat dissipation component and the second heat dissipation component, the flow control device comprising:
   a memory metal component, coupled to the first heat dissipation component and the second heat dissipation component, and
   a movable component comprising a first end and a second end, the first end coupled to a point between two ends of the memory metal component and the second end movable with respect to the first end, wherein in response to a temperature difference between the first heat dissipation component and the second heat dissipation component, the second end approaches the first heat dissipation component or the second heat dissipation component.

22. The method of claim 21, wherein the memory metal component comprises a first portion corresponding to the first heat dissipation and a second portion corresponding to the second heat dissipation component;
   wherein in response to the temperature on the first heat dissipation component being lower than the temperature on the second heat dissipation component, the first portion deforms such that the second end diverts toward the first heat dissipation component and the air flow to the second heat dissipation component is greater than the air flow to the first heat dissipation component; and
   wherein in response to the temperature on the second heat dissipation component being lower than the temperature on the first heat dissipation component, the second portion deforms such that the second end diverts toward the second heat dissipation component and the air flow to the first heat dissipation component is greater than the air flow to the second heat dissipation component.

23. The method of claim 21, wherein the first heat dissipation component is arranged adjacent to the first heat generating component and the second heat dissipation component is arranged adjacent to the second heat generating component;
   wherein in response to the first heat generating component inactive, the second end diverts toward the first heat dissipation component and the air flow to the second heat dissipation component is greater than the air flow to the first heat dissipation component; and wherein in response to the second heat generating component being inactive, the second end diverts toward the second heat dissipation component and the air flow to the first heat dissipation component is greater than the air flow to the second heat dissipation component.

24. The method of claim 21, wherein the first heat dissipation component and the second heat dissipation component cooperates with a fan providing the air flow to the first heat dissipation component and the second heat dissipation component.

* * * * *